United States Patent [19]  [11] Patent Number: 4,502,039
Vercesi et al.  [45] Date of Patent: Feb. 26, 1985

[54] KEYBOARD CODING APPARATUS

[75] Inventors: Arturo Vercesi, Rho; Francesco Marzocca, Milan, both of Italy

[73] Assignee: Honeywell Information Systems Italia, Milan, Italy

[21] Appl. No.: 373,769

[22] Filed: Apr. 30, 1982

[30] Foreign Application Priority Data

May 7, 1981 [IT] Italy .................. 21539 A/81

[51] Int. Cl.³ .............................................. G06F 3/02
[52] U.S. Cl. .............................. 340/365 S; 340/365 E
[58] Field of Search ............ 340/365 R, 365 S, 365 E; 178/17 C; 364/200, 900

[56] References Cited

U.S. PATENT DOCUMENTS

| 3,750,113 | 7/1973 | Cencel | 340/365 C |
| 4,072,820 | 2/1978 | Gunther | 340/365 S |
| 4,074,262 | 2/1978 | Nomiya | 340/365 S |
| 4,106,011 | 8/1978 | Melanson et al. | 340/365 S |
| 4,145,687 | 3/1979 | Masuda | 340/365 S |
| 4,194,188 | 3/1980 | Marino | 340/365 E |
| 4,222,038 | 9/1980 | Magerl | 340/365 S |
| 4,231,016 | 10/1980 | Ueda | 340/365 E |
| 4,305,135 | 12/1981 | Dahl et al. | 340/365 S |
| 4,408,191 | 10/1983 | Fowler | 340/365 S |
| 4,443,789 | 4/1984 | Endfield | 340/365 S |

FOREIGN PATENT DOCUMENTS 2420119 10/1975 Fed. Rep. of Germany .

OTHER PUBLICATIONS

"M6800 Microcomputer System Design Data", Motorola, Inc., 1976.
Electronics, Sohn, May 12, 1977, pp. 109–113.
IBM Technical Disclosure Bulletin, Belyeu, vol. 23, No. 3, Aug. 1980, pp. 914–916.
Intel–"8278 Programmable Keyboard Interface", (no date).

Primary Examiner—James J. Groody
Attorney, Agent, or Firm—Faith F. Driscoll; Nicholas Prasinos

[57] ABSTRACT

Keyboard coding apparatus couples to a plurality of keys and comprises a scanning interface including a counter (23), a decoder (13) and a multiplexer (22). The scanning interface, in response to each pulse received from a microprocessor (1) through an input lead (11), sends to the microprocessor on an output lead (10) a logic signal indicative of the state of any selected one of the keys. Whenever microprocessor 1 sends a pulse to the scanning interface, it increments by one the contents of an internal register and, before sending another pulse, processes the signal from the scanning interface. When the logic level of such signal indicates a condition of an actuated key, the microprocessor waits a predetermined time interval to establish that said selected key activation is valid, then waits until the selected key has been deactivated and then accesses the character code related to the actuated key from a memory location whose address is latched into its internal register. Besides simplifying the keyboard interface unit, such keyboard coding apparatus reduces considerably the number of connection leads between the microprocessor and the interface unit.

6 Claims, 5 Drawing Figures

KEYBOARD CODING APPARATUS

BACKGROUND OF THE INVENTION

1. Field of Use

The present invention relates to a keyboard coding apparatus which associates coded information to each key of a keyboard. When such key is actuated, such coded information is related to the selected alphanumeric or control character.

2. Prior Art

A keyboard is one of the simplest and most common devices for entering information into data processing systems. Like other input/output devices, a keyboard connects through an interface unit to the central unit of the equipment of which it is part.

Generally, the interface unit, under the control of the central unit, verifies according to a predetermined sequence if a key has been actuated. When the interface unit detects an actuated key, it takes the code representative of the alphanumeric or control character related to such actuated key and provides such coded information as output.

The keyboard and the interface unit generally form a single element or peripheral unit which is physically separated from the central unit. The connection between the keyboard interface unit and the central unit generally occurs through a group of leads or bus.

The leads can be classified into the following groups: a first group of leads which is used to transmit character codes from interface unit to central unit; and, a second group of leads which is used to exchange control signals between the central unit and the keyboard interface unit.

A keyboard interface unit as described above is manufactured by INTEL Corporation in the form of the 8278 Programmable Keyboard Interface integrated circuit chip. Other keyboard interface units are the subject of numerous patents, as for example, U.S. Pat. Nos. 4,222,038 and 4,106,011.

However, both the use of the keyboard interface circuits of the above mentioned U.S. patents and the use of the 8278 Programmable Keyboard Interface increase substantially the total cost of the equipment of which the keyboard is part. Besides, both the keyboard interface units of the above mentioned U.S. patents and the 8278 Programmable Keyboard Interface require a large number of leads to be connected to the central unit for exchanging data/commands/control signals.

SUMMARY OF THE INVENTION

The present invention obviates the above disadvantages. It minimizes the complexity and the number of the circuits constituting the keyboard interface unit. Also, the invention provides for connecting such interface unit to the central unit through a minimum number of signal leads in addition to any required ground or return lead and power lead.

According to the present invention, the reduction in the complexity and number of the circuits constituting the keyboard interface unit and the drastic reduction in the number of connection leads between the keyboard interface unit and the central processing unit are obtained as follows. The interface unit is connected to perform simply as a scanning logic network for the keyboard keys, while the operations of acknowledging key actuations and associating character codes to the actuated key are performed by the central unit itself. Heretofore, in the prior art, these operations were required to be performed by the keyboard interface unit.

In greater detail in the preferred of the present invention, the central unit sends a sequence of pulses to the interface unit through a first connection lead. A scanning logic network included in such interface unit is invoked in response to such pulses.

In response to each received pulse, the interface unit sends an answer signal to the central unit through a second connection lead. The answer signal has a predetermined logic or voltage level when the selected key is actuated or pressed. When such answer signal indicates the actuation of the key, the central unit recognizes the particular actuated key based upon the number of pulses it has previously sent to the interface unit and associates this number to the related character code.

These and other features will appear more clearly from the following description of a preferred embodiment of the present invention and from the accompanying drawings.

DESCRIPTION OF THE PREFERRED EMBODIMENT

Figure 1:
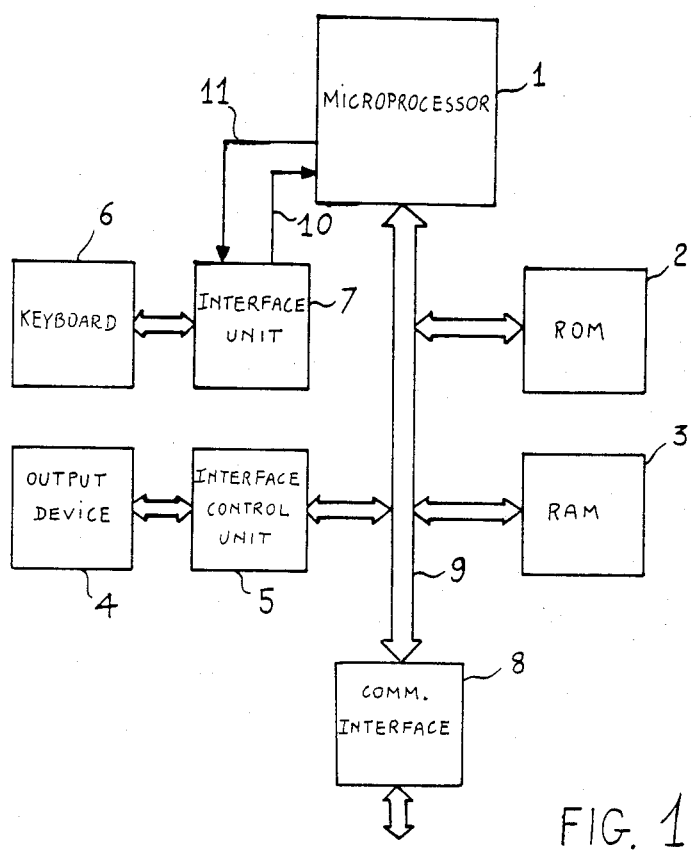
FIG. 1 shows in block diagram form the architecture of a simple data processing system using the keyboard coding apparatus of the present invention.

FIG. 1 shows in block diagram form the architecture of a simple data processing system using the keyboard coding apparatus of the present invention. For instance, such data processing system may be an intelligent terminal unit or a minicomputer.

The system of FIG. 1 comprises a microprocessor 1, a read only memory 2 used to store the control programs or microprograms of microprocessor 1, a read/write working memory 3, an output device 4, an interface unit 5 used to control output device 4, a keyboard 6 and an interface unit 7 used to scan keyboard 6. In the following description, interface unit 7 will also be referred to as "scanning interface." When the system of FIG. 1 is required to communicate and exchange information with another data processing system, as for example, in the case of an intelligent terminal, a communication interface 8 is provided. Microprocessor 1 communicates with the data processing system to which the system of FIG. 1 connects through such communications interface. The communications interface 8 is conventional in design and may, for example, utilize the 8251 Universal Synchronous/Asynchronous Receiver/Transmitter (USART) integrated circuit chip, manufactured by INTEL Corporation. Such integrated circuit chip is generally described in component Data Catalogs, published by INTEL Corporation, to which the readers may refer for additional information.

Microprocessor 1 communicates bidirectionally with control memory 2, working memory 3, control interface 5 and communication interface 8 through a group of leads 9 designated as BUS. Additionally, microprocessor 1 communicates with scanning interface 7 through a pair of leads 10 and 11.

When its resources are devoted to managing keyboard 6, microprocessor 1 executes a microprogram stored in control memory 2 and, using a so-called "polling" technique, checks the states of all the keys of keyboard 6 through scanning interface 7. In that way, microprocessor 1 determines whether or not a key has been actuated, that is, if there is a character to be processed.

In order to completely scan keyboard 6, microprocessor 1 sends a number of pulses equal to the number of keys on lead 11. Each pulse sequentially locates a different key of keyboard 6. As each pulse is sent, microprocessor 1 updates the content of an internal register of its own and receives an answer signal representative of the state of the located key through lead 10. If, through such answer signal, microprocessor 1 detects the presence of an actuated key, it reads out the code related to such key from a code table stored, for instance, in working memory 3. More particularly, microprocessor 1 associates with the actuated key, the content of a memory location whose address is already stored in the previously mentioned internal register which contains a value corresponding to the number of pulses transmitted on line 11 up to that time.

Figure 2:
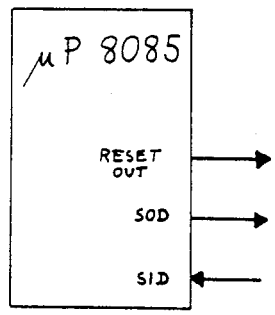
FIG. 2 shows in block form a microprocessor which may be suitably used as a central unit in the data processing system of FIG. 1.

FIG. 2 shows in block form a microprocessor which may be suitably used in the embodiment of the present invention. The microprocessor shown is the $\mu$P 8085 chip manufactured by INTEL Corporation, which is generally described in terms of architecture, functions, performance, and use in the INTEL publications titled "MSC-80, User Manual (with introduction to MSC-85)" dated October, 1977 and "8080/8085 assembly Language Programming Manual" dated 1977.

For the purposes of the present invention, it is sufficient to point out that $\mu$P 8085 chip has two communication pins connected to leads 10 and 11 of FIG. 1 and a control pin connected to all the interface units of the system of FIG. 1, including scanning interface 7. This connection is not shown in FIG. 1. Such pins are designated as follows:

| SYMBOL | FUNCTION |
|---|---|
| SID | An input pin which allows the microprocessor to receive serial input data. In particular, the information on this pin is loaded into bit 7 of microprocessor accumulator whenever a RIM (Read Interrupt Mask) microinstruction is executed. Such microinstruction is part of microinstruction set of $\mu$P 8085 microprocessor. |
| SOD | An output pin which allows the microprocessor to transmit serial output data. In particular, the information corresponding to bit 7 of microprocessor accumulator is applied to such pin whenever bit 6 of the same accumulator is at logical or binary 1 level and a SIM (Set Interrupt Mask) microinstruction is executed. Such microinstruction is also part of microinstruction set of $\mu$P 8085 microprocessor. |
| RESET OUT | An output pin on which the microprocessor |

-continued

| SYMBOL | FUNCTION |
|---|---|
| | sends a signal to the other units of the system in order to place them in an initial or reset state. |

Before continuing with the present description, the simple routine by whose execution by the $\mu$P 8085 microprocessor generates a pulse on the SOD pin will now be explained. Such routine involves the following steps:

(a) the microprocessor loads information having bits 6, 7 set to a logic 1 level into an accumulator by means of a first loading microinstruction;

(b) the microprocessor transfers logic or binary 1 level of accumulator bit 7 to SOD pin by means of a first SIM microinstruction. This corresponds to the leading edge of the pulse applied to the SOD pin;

(c) the microprocessor loads into accumulator information having bit 6 set to logic 1 level and bit 7 set to logic 0 level by means of a second loading microinstruction; and, (d) the microprocessor transfers logic 0 level of accumulator bit 7 to SOD pin by means of a second SIM microinstruction. This corresponds to the trailing edge of the output pulse.

As already mentioned, in order to check the state of each key of keyboard 6, the $\mu$P 8085 microprocessor 1, just after having sent a pulse, loads into accumulator bit position 7, the logic level present on SID pin by means of a RIM microinstruction.

By means of logic and jump microinstructions, microprocessor 1 verifies if such logic level is 1 or 0 and, therefore, based upon the particular level, follows suitable branches in executing its program.

Figure 3:
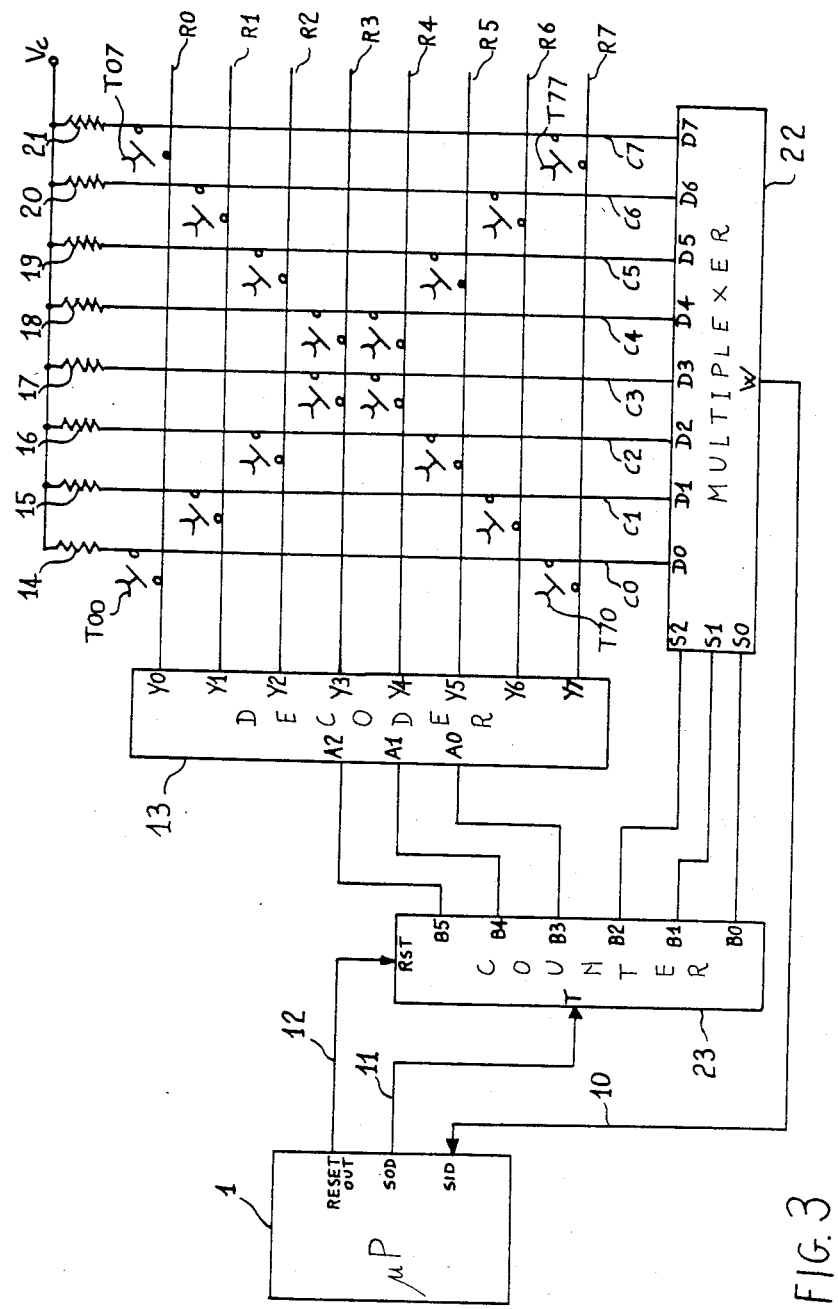
FIG. 3 shows in detail the interface unit which, according to the present invention, connects between the keyboard and the microprocessor of FIG. 1.
Figure 4:
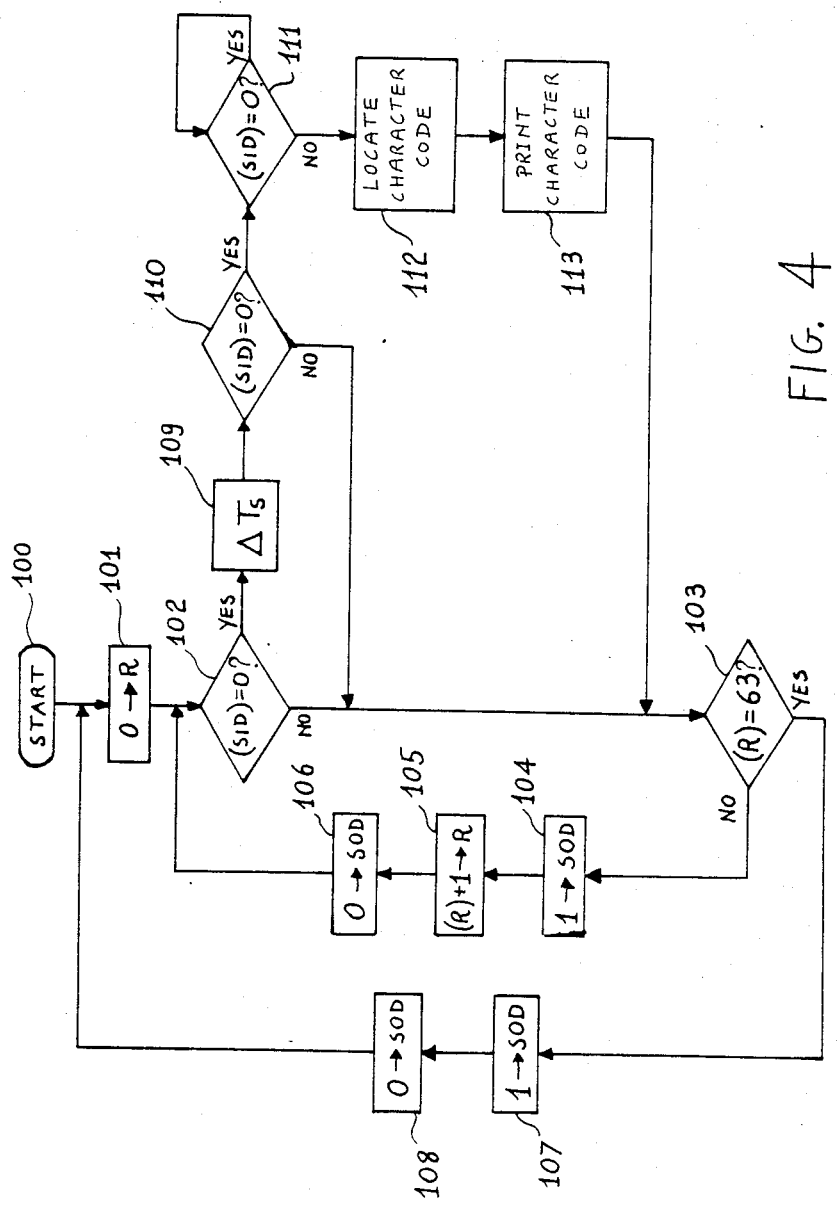
FIG. 4 is a flow diagram illustrating the operations executed by the microprocessor in order to scan the keyboard of FIG. 1 and to detect an actuated key, according to the present invention.

The above mentioned will become clearer from the analysis of FIGS. 3 and 4. FIG. 3 shows in detail, scanning interface 7, keyboard 6 and the connection between such interface and microprocessor 1 in accordance with the present invention. Keyboard 6, for example, is mechanical in design with 64 keys and comprises a plurality of leads arranged in a matrix of 8 rows designated R0 through R7 and 8 columns designated C0 through C7. A key Tij of keyboard 6 is associated with each matrix point Pij wherein $0 \leq i \leq 7$ and $0 \leq j \leq 7$ defined by the row lead i and by the column lead j such that key Tij when pressed causes an electrical connection or continuity between the row lead i and column lead j.

Each of the row leads R0 through R7 are respectively connected to a corresponding one of the outputs Y0 through Y7 of a decoder 13 having 3 inputs and 8 outputs. Each of the column leads C0 through C7 are connected at one end to a direct supply voltage Vc through a corresponding one of the resistors 14 through 21 and at the other end to one of the inputs D0 through D7 of a multiplexer 22 having eight inputs and one output.

Each of the selection inputs 50, 51 and 52 of multiplexer 22 is connected to a corresponding one of the least significant bit outputs B0, B1 and B2 of a 6-bit binary counter 23. Each of the most significant outputs B3, B4 and B5 of counter 23 is connected to a corresponding one of the inputs A0, A1 and A2 of decoder 13. An output W of multiplexer 22 is connected to SID pin of microprocessor 1 ($\mu$P 8085) through lead 10.

An increment input T of counter 23 is connected to SOD pin of microprocessor 1 through lead 11. A reset input RST of counter 23 is connected via lead 12 to RESET OUT pin of microprocessor 1.

The circuits constituting the scanning interface, that is, counter 23, multiplexer 22 and decoder 13, do not require any further explanation because they are well known to those skilled in the art. They may be constructed from generally available integrated circuits. For example, multiplexer 22 and decoder 13, respectively, may be constructed for integrated circuit chips 74LS251 and 74LS138. Counter 23 may be constructed from two integrated circuit chips 74LS193 connected in cascade. All the mentioned integrated circuit chips are manufactured by Texas Instruments Corporation. It will be noted that two integrated circuits 74LS193 when cascaded to form an 8-bit binary counter. However, only the six last significant outputs of the counter are used because the keyboard of the embodiment of the present invention has 64 keys (i.e., a 6-bit binary counter is sufficient for a complete scanning of the 64 keys of the keyboard).

DESCRIPTION OF OPERATION

The operation of the scanning interface is very simple. Let us suppose that outputs B5, B4, B3, B2, B1, B0 of counter 23 are set to the starting binary bit pattern 000000. This starting condition may be the result from the cyclic operation of the counter and a general reset produced by an active signal being applied to the RESET OUT pin by microprocessor 1. In such a case, outputs B5, B4 and B3 produce a 0 logic and voltage level on output Y0 of decoder 13. Therefore, row lead R0 may be considered as being connected to ground potential.

Additionally, outputs B2, B1 and B0 of counter 23, which connect to selection inputs S2, S1 and S0 of multiplexer 22, condition multiplexer 22 to transfer the logic/electric level present on column lead C0 to output W. When key T00, associated with row lead R0 and column lead C0 is pressed, a 0 logic/electric level appears at output W of multiplexer 22. Conversely, when such key is not pressed, a 1 logic/electric level appears at output W.

When the microprocessor applies a pulse to input T of counter 23, the counter 23 is incremented by one and the outputs assume the binary bit pattrn 000001. In such a case, the decoder 13 and multiplexer 22 determine whether the key associated with row lead R0 and column lead C1 is pressed (output W of multiplexer at 0 logic level) or not (output W at 1 logic level). Thus, through a series of 63 pulses, it is possible to completely scan the keyboard keys, such scanning being made for the remaining rows of the matrix according to the arrangement of keys.

Before considering the operations executed by microprocessor 1 in order to scan keyboard 6 and detect an actuated key, consideration will be first given to two problems which arise in the use of a keyboard and which the microprocessor 1 has to overcome. The first problem which may be found in a keyboard of mechanical type, concerns the transient phenomena occurring as soon as a key Tij of the keyboard of FIG. 3 is pressed. Each key Tij does not immediately cause a stable condition of electric connection between row lead i and column lead j. Due to the bounces of key Tij, such stable condition occurs after an initial interval $\Delta T0$. The interval $\Delta T0$ depends on the type of mechanical keyboard used and generally has a duration of one or more milliseconds (1-2 ms). Because during the interval $\Delta T0$ several keybord scannings are performed, microprocessor 1, on checking the state of a key Tij may detect the state or condition of actuated key Tij several times due to the initial bounces, and consequently treat or process the character related to such key several times.

In order to avoid this situation, microprocessor 1 must operate in the following way. As soon as it detects a depressed key, it stops for a time interval $\Delta Ts$, with $\Delta Ts > \Delta T0$, and then microprocessor 1 again checks if such key is still depressed. Only when the depressed condition of the key persists, does microprocessor 1 acknowledges this condition and goes on to associate the depressed key the related character code. It should be clear that the entire phase or operation of pressed key acknowledgement must take place during the time interval in which the key remains in this condition. The duration of such time interval depends on the typewriting speed of the operator and is generally never shorter than tens of milliseconds (20-30 ms). In the present invention, time interval $\Delta Ts$ has been suitably fixed to equal 10 ms in order to fulfill the above requirements.

The second problem in using a keyboard concerns the start of the phase during which the corresponding character code is associated to the pressed key. If such phase starts as soon as a depressed key is acknowledged, it may happen that this key still continues to remain depressed when the operations related to such phase are completed, resulting in undesired repetition of operations related to the same key. This situation is avoided by making the mentioned phase start as soon as the key in question returns to the nondepressed condition.

FIG. 4 is a flow diagram illustrating the operations performed by microprocessor 1 in order to scan the keyboard and identify a pressed key. In describing the operations shown in the flow diagram of FIG. 4, as well as those shown in the flow diagram of FIG. 5, the expression "the microprocessor enters block i" will sometimes be used. This expression means that microprocessor 1 executes the operation described by block i.

The flow diagram of FIG. 4 begins at START block 100 and continues to block 101 wherein microprocessor 1 resets an internal register R of its own and presets scanning interface 7 to an initial state by applying a RESET OUT command to line 12 of FIG. 3.

In block 102, microprocessor 1 checks or tests the logic level of the signal applied to its SID input. That is, it initially checks if key T00 is pressed or not.

When microprocessor 1 detects that key T00 is not depressed [(SID)≠0], it goes on to check if the contents of its internal register R are equal to 63 as shown in block 103. That is, it checks if a keyboard scanning has been completed. When the contents of register R are less than 63, microprocessor 1 applies a 1 logic level to its SOD output (block 104), increments by one the contents of its internal register R (block 105) and then switches its SOD output to a 0 logic level (block 106).

The pulse provided by microprocessor 1 increments by one, the contents of counter 23 of FIG. 3. In the manner previously described, a signal indicative of the state of the next key which is subsequent to the one checked, is applied to the SID input of microprocessor 1 by counter 23, decoder 13 and multiplexer 22.

Again, microprocessor 1 checks such signal as shown in block 102 and, if this last signal is at logic 1 level (i.e., the selected key is not pressed), microprocessor 1 goes on to scan the keyboard according to the loop comprising blocks 103, 104, 105, 106 and 107.

At the end of a complete scan, microprocessor 1 detects that the contents of its internal register R are equal to 63. As seen from blocks 107 and 108, it sends a further pulse on its SOD output so as to reset the outputs of counter 23 of FIG. 3. Then, the microprocessor starts to scan again the keyboard by entering block 101.

As seen from block 102, if at a certain time, microprocessor 1 detects that a key Tij still depressed [(SID)=0], it enters a wait state of length $\Delta Ts = 10$ ms (block 109). This wait state is obtained, for example, by having microprocessor 1 execute a predetermined number of NOP (No Operation) microinstructions. Following that, microprocessor 1 again checks the state of the considered key Tij as shown in block 110. If, at this time, such key is not pressed [(SID)≠0], microprocessor 1 enters again block 103. If, on the contrary, microprocessor 1 detects that the key Tij in question is still pressed [(SID)=0], it acknowledges a valid actuation of such key and enters block 111 waiting for key Tij to be returned to the nondepressed state or condition.

As soon as microprocessor 1 detects that the selected key Tij is no longer depressed [output (SID)≠0 of block 111], it accesses the character code associated with key Tij (block 112), such character code being stored, for example, in the working memory 3 of FIG. 1 in a location whose address is specified by the contents of microprocessor internal register R. After having performed a routine of character code processing corresponding to block 113, as for example, such as sending commands for printing the character, microprocessor 1 enters again block 103.

It is to be noted that the operations described in FIG. 4 do not allow microprocessor 1 to detect the presence of several keys being depressed at the same time. The reason is microprocessor 1 stops at the first depressed key it detects during scanning and remains in that state until the key returns to the nondepressed condition. On the other hand, most keyboards provide that some functions and characters be produced only when several keys are depressed at the same time. For example, all the keyboards are provided with a "shift" key by which it is possible to associate two characters with each of the remaining keys with few exceptions. In other words, when the "shift" key is not depressed, a particular character is associated with a key. However, when the "shift" key is pressed, another character is associated with the same key (e.g. capital letters).

Also, most keyboards include a "repeat" key. When pressed, the "repeat" allows the repetition of the character associated with the key pressed immediately after such "repeat" key. The character is repeated as long as the corresponding key remains depressed.

Figure 5:
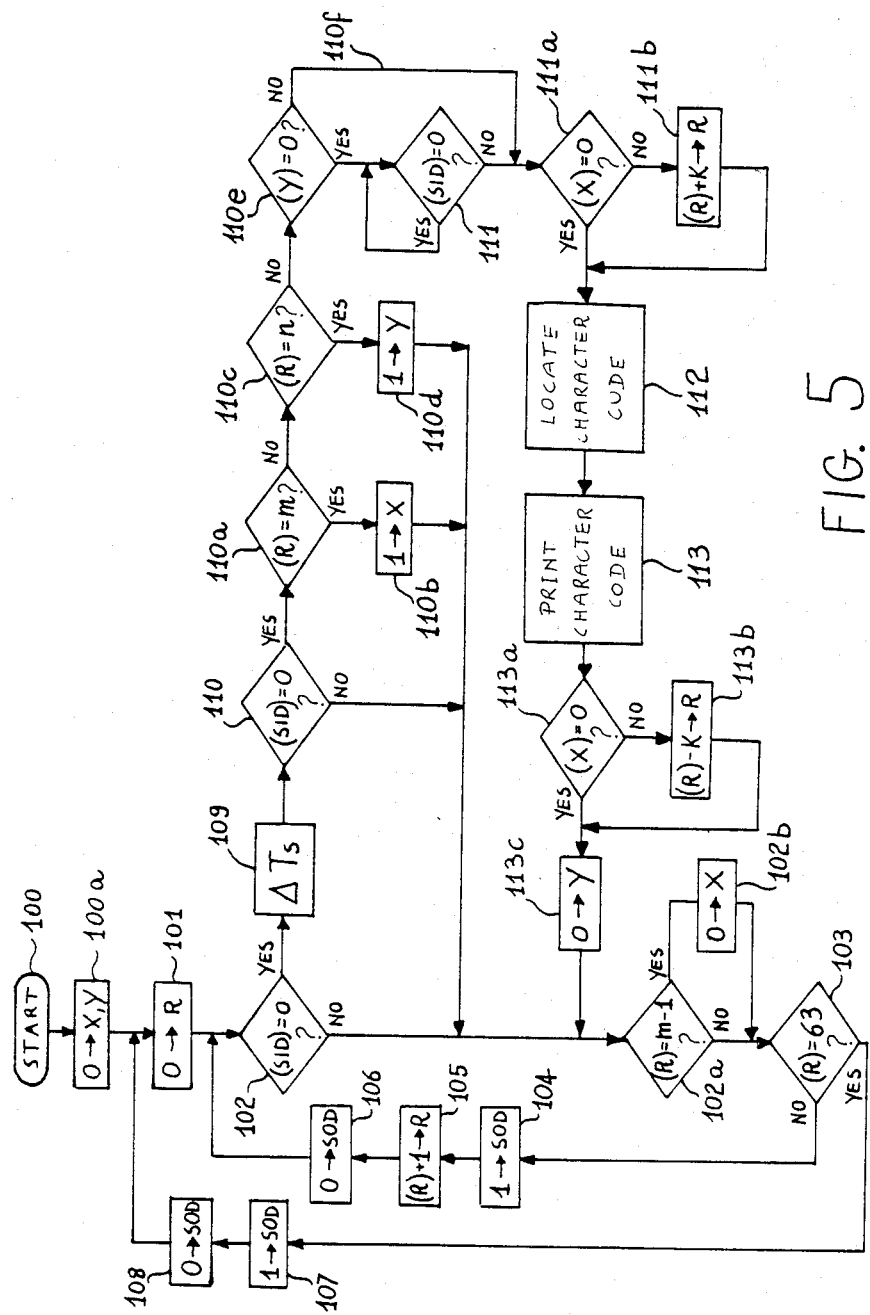
FIG. 5 is a flow diagram illustrating the operations executed by the microprocessor in order to detect the concurrent actuation of additional keys.

FIG. 5 is a flow diagram illustrating the operations which microprocessor 1 must perform in order to acknowledge the presence of several keys being depressed. It is assumed that the keyboard 6 of FIG. 3 is provided with a "shift" key whose state microprocessor 1 checks after it sends m pulses on line 11 and a "repeat" key whose state microprocessor 1 checks after it sends n pulses on line 11. Additionally, it is assumed that when the first character code associated to a particular key is stored in working memory 3 of FIG. 1 at an address N, the second character code associated with the same key (when the "shift" key is pressed at the same time) is stored in the same memory at an address N+K. It is to be noted that the same numeric references in FIG. 4 are given to the blocks of FIG. 5 illustrating identical operations to be performed by microprocessor 1. Such blocks will not be described, since they were already described in connection with FIG. 4.

Referring to FIG. 5, it is seen that block 100a is inserted between blocks 100 and 101. When the microprocessor enters block 100a, it resets two internal registers X, Y of its own. Registers X, Y are required to latch the state or condition of the "shift" key and "repeat" key, respectively, as described herein. It will be noted in FIG. 5 that block 102a is inserted before block 103. At this point, microprocessor 1 checks that it has tested the state of the key scanned immediately before the "shift" key. In the negative case where (R)≠m−1, microprocessor 1 checks if the keyboard has been completely scanned as shown in block 103.

In the affirmative case where (R)=m−1, microprocessor 1, before entering block 103, resets register X even if this register was already in the reset state (block 102b). Thus, register X is reset at the end of each translated scanning wherein scanning refers to the scanning from key m to key 63 and then from key 0 to key m−1. This must be done because microprocessor 1 only recognizes a "shift" key change from the nondepressed state to the depressed state. In fact, it may happen that an operator may press the "shift" key and as a consequence of this, as described herein, microprocessor 1 loads a "1" into register X and then the operator releases such key without having made use of the "shift" function.

As seen from blocks 102a and 102b, the pressed "shift" key condition is stored or latched only during translated scanning. At the beginning of the subsequent translated scanning, when microprocessor 1 still detects that the "shift" key is depressed, it again latches such condition. When microprocessor 1 acknowledges the valid actuation of a key wherein the output (SID)=0 in block 110, it enters the block 110 wherein it checks if the depressed key is the "shift" key. In the affirmative case where (R)=m, it stores such condition in register X (block 110b) and enters block 102a. In the negative case where (R)≠m, it checks if the depressed key is the "repeat" key (block 110c). When microprocessor 1 detects that the depressed key is the "repeat" key, it stores such condition in register Y (block 110d) and enters block 102a, otherwise it enters block 110e.

As seen from block 110e, microprocessor 1 checks that it had previously stored the pressed "repeat" key condition. In the negative case where (Y)=0, it enters block 111 (previously described during the explanation of FIG. 4), and then block 11a. In the other case where (Y)≠0, it immediately enters block 111a through path 110f.

In block 111a, microprocessor 1 checks that the pressed "shift" key condition is latched for the translated scanning in progress. In the negative case where (X)=0, microprocessor 1 immediately enters block 112 and then block 113. In the other case where (X)≠0, it adds the displacement value K to the contents of register R (block 111b) and enters block 112 and then block 113.

When microprocessor 1 finishes operating on the accessed character code, it enters block 113a where it again checks if the pressed "shift" key condition is latched. In the negative case where (X)=0, it immediately enters block 113c where it removes the possible pressed "repeat" key condition by resetting register Y, even if this register was already reset. In the affirmative case where (X)≠0, it operates to restore the old contents in register R (block 113b) and then enters block 113c. Then, the microprocessor enters block 102a from block 113c.

From an analysis of the flow diagram of FIG. 5, it will be noted that when an operator presses the "repeat" key and then a second key, microprocessor 1 soon accesses and operates on the character code associated with this second key. Also, when both the "repeat" key and such second key continue to be depressed, microprocessor 1 continues accessing and operating on the character code related to said second key for each keyboard scanning.

The repetition period of the keyboard coding apparatus of the present invention is therefore determined by the cycle of keyboard scanning established by microprocessor 1. It is clear that such repetition period may be suitably increased or lengthened according to the requirements by inserting within path 110 of FIG. 5a block specifying a wait ΔTr. It will be appreciated that the flow diagrams of FIGS. 4 and 5 may be easily translated into microprograms by those skilled in the art, utilizing the instruction set of the μP 8085 microprocessor.

Many changes may made to the described keyboard coding apparatus of the preferred embodiment without departing from the teachings of the present invention. For example, other microprocessors having inputs and outputs for receiving and transmitting serial data may be used in place of the μP 8085 microprocessor of the preferred embodiment (e.g. the μP 2650 microprocessor chip manufactured by U.S. Philips Corporation).

What is claimed is:

1. Keyboard coding apparatus and control apparatus interconnected through an interface consisting of a minimum number of interconnecting signals lines, said keyboard coding apparatus including:

a keyboard having a plurality of keys; and, scanning means connected to select each of said keys in a predetermined sequence for detecting the actuated non-actuated state of said each of said keys, said scanning means having first and second input terminals and an output terminal; and, said control apparatus including:

memory means having a plurality of locations for storing control programs and predetermined locations for storing character codes related to the selection of said keys; and, processing means coupled to said memory means, said processing means having an internal register for storing a value for accessing said predetermined locations and first and second output terminals and an input terminal connected to said first and second input terminals and to said output terminal respectively of said scanning means providing said interface consisting of said minimum number of interconnecting signal lines; and, said processing means applying pulses to said first and second output terminals respectively for resetting said scanning means to a known state and for conditioning said scanning means to select a next key, said scanning means in response to each of said pulses applied to said second input terminal being operative to apply to said processing means input terminal a logic signal indicative of said actuated/non-actuated state of a selected key, said processing means being operative in response to each said logic signal indicative of said non-actuated state of said key to transfer another pulse to said second input terminal of said scanning means and concurrently increment by one said value stored by internal register and said processing means being operative in response to said each logic signal indicative of said actuated state of said selected key to address one of said predetermined locations of said memory means specified by said value stored in said internal register for accessing a character code representative of said selected key and thereafter transfer said another pulse to said scanning means and concurrently increment said internal register value.

2. Keyboard coding apparatus of claim 1 wherein said keys are arranged in a matrix of C columns and R rows, each of said keys when actuated, producing an electrical connection between one of C columns and one of R rows, and said scanning means further including:

counting means having an increment input terminal and a first and a second group of output terminals, said increment input terminal corresponding to said scanning means second input terminal;

decoding means having a group of input terminals connected to said first group of output terminals of said counting means and a plurality of output terminals, each of said output terminals being connected to a different one of said R row leads; and, multiplexing means having a plurality of input terminals, each input terminal being connected to a different one of said C column leads, a set of selection input terminals, each selection input terminal being connected to one of said second group of output terminals of said counting means, and an output terminal, said output terminal corresponding to said scanning means output terminal.

3. The keyboard coding apparatus of claim 1 wherein said processing means comprises a microprocessor having an input pin and an output pin respectively for receiving and transmitting serial data, said input and output pins respectively being connected to said output terminal and to said second input terminal of said scanning means.

4. A system for processing keyboard signals received from a keyboard having a number of keys being connected within a matrix of rows and column leads wherein each of said keys when depressed produces an electrical connection between one of said column leads and one of said row leads, said system comprising:

processing means including:

a serial output data (SOD) terminal for applying output pulses for scanning the states of said number of keys;

an internal register storing signals representative of a count of said output pulses applied to said (SOD) terminal; and, a serial input data (SID) terminal for receiving logic signals indicative of said states of said number of keys;

a first memory store coupled to said processing means, said first store having a plurality of storage locations for storing at least one control sequence used in processing said keyboard signals;

a second memory store coupled to said processing means, said second store having a plurality of storage locations for storing a plurality of character codes corresponding to said number of keys, each character code being related to a predetermined one of said keys;

scanning means coupled to said processing means and to said row and column leads of said matrix, said scanning means including:

input binary counter means for storing a binary count defining which one of said keys is to be scanned, said counter means being coupled to said matrix and to said SOD terminal, and operative in response to each of said output pulses to increment by one said binary count for selecting the next key within said matrix whose state is to be scanned; and, output means coupled to said counter means, to said matrix and to said SID terminal, said output means being conditioned by the binary count stored in said counter means to apply a logic signal to said SID terminal indicative of the state of said key selected to be scanned, said processing means when operating under the control of a first one of said control sequences in response to said logic signal indicating that said selected key is actuated, being conditioned to address one of said plurality of memory locations of said second memory specified by the count contents of said internal register corresponding to said selected key for read out of one of said plurality of character codes representative of said actuated key and said processing means being operative to generate a next one of said output pulses at said SOD terminal and increment said internal register count by one for selecting the next key to be scanned.

5. The system of claim 4 wherein said processing means is conditioned by said first one of said control sequences to wait for a predetermined time interval to establish that said selected key actuation is valid, said processing means in response to said logic signal indicating that said selected key is still actuated after said predetermined time interval being further conditioned to address said one of said locations for said read out of said one of said plurality of character codes representative of said actuated key, only when said logic signal indicates that said selected key is no longer being actuated.

6. The system of claim 5 wherein said number of keys includes a shift key, said processing means further including:

a first register for storing a signal indicative of the state of said shift key, said processing means being operative when said internal register stores a count having a preestablished value m and said shift key is depressed to force said first register to a predetermined state indicating the depression of said shift key, said processing means being operative in response to said logic signal indicative of said actuated key to access either a first character code from said second memory store at a location defined by the contents of said internal register when said first register is not in said predetermined state or a second character code at a location defined by the sum of the contents of said internal register and a predetermined constant when said first register is in said predetermined state.

* * * * *